(12) United States Patent
Chin

(10) Patent No.: US 11,829,569 B2
(45) Date of Patent: Nov. 28, 2023

(54) DISPLAY SUBSTRATE, METHOD FOR FORMING DISPLAY SUBSTRATE, AND DISPLAY DEVICE

(71) Applicants: MIANYANG BOE OPTOELECTRONICS TECHNOLOGY CO., Ltd., Sichuan (CN); BOE Technology Group Co., Ltd., Beijing (CN)

(72) Inventor: Yuanchen Chin, Beijing (CN)

(73) Assignees: MIANYANG BOE OPTOELECTRONICS TECHNOLOGY CO., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/620,622

(22) PCT Filed: Feb. 5, 2021

(86) PCT No.: PCT/CN2021/075543
§ 371 (c)(1),
(2) Date: Dec. 17, 2021

(87) PCT Pub. No.: WO2021/164581
PCT Pub. Date: Aug. 26, 2021

(65) Prior Publication Data
US 2022/0397984 A1    Dec. 15, 2022

(30) Foreign Application Priority Data
Feb. 20, 2020 (CN) .......................... 202010103965.9

(51) Int. Cl.
*G06F 3/044* (2006.01)
*G02B 5/00* (2006.01)

(52) U.S. Cl.
CPC .......... *G06F 3/0446* (2019.05); *G02B 5/005* (2013.01); *G06F 3/0443* (2019.05);
(Continued)

(58) Field of Classification Search
None
See application file for complete search history.

(56) References Cited

U.S. PATENT DOCUMENTS 9,370,074 B2 * 6/2016 Kurokawa ............. H10K 59/65
2017/0213872 A1 * 7/2017 Jinbo ................... H10K 50/865
(Continued)

FOREIGN PATENT DOCUMENTS

| CN | 106019664 A | * 10/2016 | ......... G02F 1/13338 |
| CN | 107026244 A | * 8/2017 | ........... H01L 27/322 |

(Continued)

OTHER PUBLICATIONS

CN 202010103965.9 first office action.
(Continued)

*Primary Examiner* — Duane N Taylor, Jr.
(74) *Attorney, Agent, or Firm* — IPro, PLLC

(57) ABSTRACT

A display substrate, a method for forming a display substrate, and a display device are provided. The display substrate includes: a plurality of pixels arranged in an array on a base substrate; a light-shielding pattern at a side, away from the base substrate, of the pixels, and an orthographic projection of the light-shielding pattern on the base substrate is overlapped with an orthographic projection of a gap between adjacent pixels on the base substrate; a light extraction structure arranged at a light-emitting side of the pixel and a side of the light-shielding pattern adjacent to the base substrate, a light-emitting direction of the light extraction structure is a direction of the light extraction structure away from the pixels, and an orthographic projection of the light
(Continued)

extraction structure on the base substrate is overlapped with an orthographic projection of the pixels on the base substrate.

18 Claims, 7 Drawing Sheets

(52) U.S. Cl.
CPC .............. *G06F 2203/04103* (2013.01); *G06F 2203/04111* (2013.01); *G06F 2203/04112* (2013.01)

(56) References Cited

U.S. PATENT DOCUMENTS

| | | | |
|---|---|---|---|
| 2018/0149872 A1 | 5/2018 | Choi et al. | |
| 2019/0051711 A1 | 2/2019 | Lee et al. | |
| 2019/0221779 A1 | 7/2019 | Jang et al. | |
| 2019/0324582 A1 | 10/2019 | Lin et al. | |
| 2019/0341428 A1 | 11/2019 | Lee et al. | |
| 2019/0371872 A1 | 12/2019 | Nendai et al. | |
| 2020/0243802 A1 | 7/2020 | Ju et al. | |
| 2020/0266392 A1 | 8/2020 | Lee | |
| 2020/0285104 A1* | 9/2020 | Meng | G02F 1/133524 |
| 2021/0072593 A1* | 3/2021 | Meng | G02F 1/133603 |
| 2021/0074770 A1 | 3/2021 | Choe | |
| 2021/0126221 A1 | 4/2021 | Ye | |
| 2021/0356819 A1* | 11/2021 | Zhao | G02F 1/133512 |

FOREIGN PATENT DOCUMENTS

| | | | |
|---|---|---|---|
| CN | 107026244 A | 8/2017 | |
| CN | 107340928 A | 11/2017 | |
| CN | 108123058 A | 6/2018 | |
| CN | 109388292 A | 2/2019 | |
| CN | 109599425 A | 4/2019 | |
| CN | 110034164 A | 7/2019 | |
| CN | 111108602 A | 5/2020 | |
| CN | 111475042 A | 7/2020 | |
| CN | 111584734 A | 8/2020 | |
| CN | 112466908 A | 3/2021 | |
| WO | WO-2018124848 A1 * | 7/2018 | ............... A44C 1/00 |
| WO | 2021119992 A1 | 6/2021 | |

OTHER PUBLICATIONS

PCT/CN2021/075543 international search report and written opinion.
CN 202010103965.9 third office action.

* cited by examiner

DISPLAY SUBSTRATE, METHOD FOR FORMING DISPLAY SUBSTRATE, AND DISPLAY DEVICE

CROSS-REFERENCE TO RELATED APPLICATIONS

This application is the U.S. national phase of PCT Application PCT/CN2021/075543 filed on Feb. 5, 2021, which claims priority to Chinese Patent Application No. 202010103965.9 filed in China on Feb. 20, 2020, the entire contents of which are incorporated herein by reference.

TECHNICAL FIELD

The present disclosure relates to the field of display technologies, and in particular, to a display substrate, a method for forming a display substrate, and a display device.

BACKGROUND

In the related art, in order to improve the light extraction efficiency of the display substrate, a light extraction structure is disposed on the light-emitting side of the display substrate, but light extracted by the light extraction structure exits through adjacent pixels, which causes a problem of image blur.

SUMMARY

The embodiment of the present disclosure is as follows:
In one aspect, a display substrate is provided in the present disclosure, including:
  a plurality of pixels arranged in an array on a base substrate;
  a light-shielding pattern at a side, away from the base substrate, of the pixels, and an orthographic projection of the light-shielding pattern on the base substrate is overlapped with an orthographic projection of a gap between adjacent pixels on the base substrate;
  a light extraction structure arranged at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate.
Optionally, the display substrate further includes: an encapsulation layer covering the plurality of pixels;
where the light-shielding pattern is arranged at a side, away from the pixels, of the encapsulation layer, and the light-shielding pattern is made of a conductive material and is reused as a touch electrode.
Optionally, the touch control electrode includes a plurality of touch control sub-electrodes which are arranged on the same layer and are separated from each other; or
the touch control electrodes include first touch control sub-electrodes and second touch control sub-electrodes arranged on the same layer, where the first touch control sub-electrodes are and distributed along a second direction, the second touch control sub-electrodes are distributed along a third direction, the third direction is intersected with the second direction, adjacent second touch control sub-electrodes are directly connected, and adjacent first touch control sub-electrodes are connected through touch control electrode bridges of different layers.

Optionally, the touch electrode is made of metal meshes, each metal mesh corresponds to one pixel of the display substrate, and an orthographic projection of the pixel on the base substrate coincides with an orthographic projection of a hollow area defined by the corresponding metal mesh on the base substrate.

Optionally, the light extraction structure includes one light extraction layer; or the light extraction layer includes at least two light extraction layers which are sequentially arranged along a direction away from the base substrate.

Optionally, the light extraction layer includes a first light extraction layer, the first light extraction layer includes at least two layers of light-transmitting materials arranged in a stacked manner, and a refractive index of the light-transmitting materials increases or undulates in a direction away from the base substrate.

Optionally, the first light extraction layer includes a first light-transmitting material layer and a second light-transmitting material layer arranged in a stacked manner, the second light-transmitting material layer is arranged on a side of the first light-transmitting material layer away from the base substrate, and a plurality of grooves are disposed on a side surface of the first light-transmitting material layer facing the second light-transmitting material layer.

Optionally, the display substrate further includes an encapsulation layer covering the plurality of pixels, where the encapsulation layer includes an inorganic insulating layer, the light-transmitting material layer is reused as the inorganic insulating layer, and a side surface of the inorganic insulating layer, which is away from the pixels, and/or a side surface of the inorganic insulating layer, which is close to the pixels, is provided with a plurality of grooves.

Optionally, the display substrate further includes an encapsulation layer covering the plurality of pixels, a touch electrode on a side of the encapsulation layer away from the pixels, the touch control electrodes include first touch control sub-electrodes which are arranged on the same layer and distributed along a second direction and second touch control sub-electrodes which are distributed along a third direction, the third direction is intersected with the second direction, adjacent second touch sub-electrodes are directly connected, adjacent first touch sub-electrodes are connected through a touch electrode bridge of different layers, a first insulating layer is arranged between the first touch sub-electrode, the second touch sub-electrode and the touch electrode bridge, the light-transmitting material layer is reused with the first insulating layer, and a plurality of grooves are formed in a side surface, away from the pixels, of the first insulating layer and/or a side surface, close to the pixels, of the first insulating layer.

Optionally, the display substrate further includes an encapsulation layer covering the plurality of pixels, a buffer layer arranged on a side of the encapsulation layer away from the pixels, and a touch electrode arranged on a side of the buffer layer away from the pixels, where the light-transmitting material layer is reused for the buffer layer, and a plurality of grooves are arranged on a surface of a side of the buffer layer away from the pixels and/or a surface of a side of the buffer layer close to the pixels.

Optionally, the display substrate further includes an encapsulation layer covering the plurality of pixels, a touch electrode arranged on a side of the encapsulation layer away from the pixels, and a second insulating layer arranged on a side of the touch electrode away from the pixels, where the light-transmitting material layer is reused with the second insulating layer, and a plurality of grooves are formed in a surface of the second insulating layer on a side close to the pixels.

Optionally, the light extraction layer includes a second light extraction layer including a light-transmitting material layer and a plurality of refractive particles within the light-transmitting material layer, a refractive index of the refractive particles is greater than a refractive index of the light-transmitting material layer.

Optionally, an orthographic projection of the light extraction layer on the base substrate coincides with an orthographic projection of the pixels on the base substrate; or, the light extraction structure is a unitary layer.

Optionally, a refractive index of the first light-transmitting material layer is less than a refractive index of the second light-transmitting material layer.

Optionally, the first light extraction layer includes a third light-transmitting material layer, a fourth light-transmitting material layer and a fifth light-transmitting material layer sequentially disposed in a direction away from the base substrate, where a refractive index of the third light-transmitting material layer is smaller than a refractive index of the fourth light-transmitting material layer, and a refractive index of the fourth light-transmitting material layer is smaller than a refractive index of the fifth light-transmitting material layer.

Optionally, the light extraction layer includes a first light extraction layer and a second light extraction layer, the orthographic projections of the first and second light extraction layers on the base substrate coincide.

Optionally, the light extraction layer includes a first light extraction layer and a second light extraction layer, an orthographic projection of the second light extraction layer on the base substrate covers an orthographic projection of a plurality of pixels on the base substrate.

A display device including the display device hereinabove is further provided in the present disclosure.

A method for forming a display substrate is further provided in the present disclosure, including:

forming a plurality of pixels arranged in an array on a substrate;

forming a light-shielding pattern on a side of the pixels away from the base substrate, where an orthographic projection of the light-shielding pattern on the base substrate is overlapped with an orthographic projection of a gap between adjacent pixels on the base substrate;

forming a light extraction structure at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate.

DETAILED DESCRIPTION

Figure 1A:
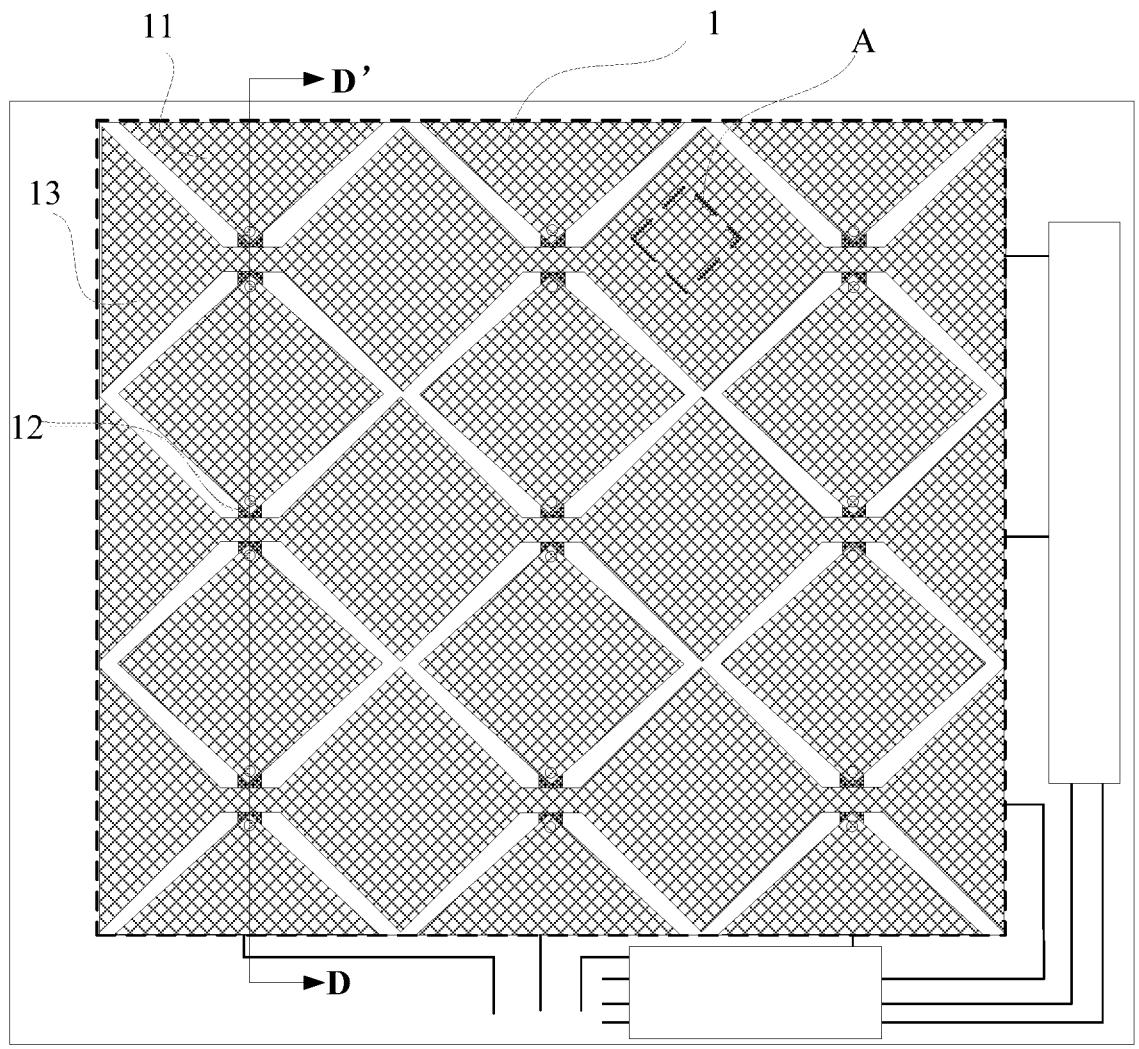
FIGS. 1A-1B are schematic plan views of a display substrate.

To make the technical problems, technical solutions and advantages to be solved by the embodiments of the present disclosure clearer, the following detailed description is given with reference to the accompanying drawings and specific embodiments.

In the related art, in order to improve the light extraction efficiency of the display substrate, a light extraction structure is provided on the light-emitting side of the display substrate. However, for a small-sized high-resolution display product, because the distance between adjacent pixels is small, light rays taken out by the light extraction structure can easily exit through the adjacent pixels, and the problem of image blurring is caused.

The embodiment of the disclosure provides a display substrate, a manufacturing method thereof and a display device, which can improve the light extraction efficiency of the display substrate and avoid the occurrence of image blurring.

An embodiment of the present disclosure provides a display substrate, including:

a plurality of pixels arranged in an array on a base substrate;

a light-shielding pattern at a side, away from the base substrate, of the pixels, and an orthographic projection of the light-shielding pattern on the base substrate is overlapped with an orthographic projection of a gap between adjacent pixels on the base substrate;

a light extraction structure arranged at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate.

In this embodiment, a light extraction structure is disposed on the light-emitting side of the pixel, and the light extraction structure can improve the light extraction rate of the display substrate; meanwhile, the light-shielding pattern is arranged on a side, away from the base substrate, of the pixel, the orthographic projection of the light-shielding pattern on the base substrate is overlapped with the orthographic projection of the gap between the adjacent pixel on the base substrate, so that the light-shielding pattern can shade light rays which are taken out through the light extraction structure and shoot to the adjacent pixel, the light rays taken out through the light extraction structure are prevented from being emitted through the adjacent pixel, and the problem of image blurring is avoided.

The orthographic projection of the light extraction structure on the base substrate base can be arranged in the orthographic projection of the pixel on the base substrate base, or the orthographic projection of the pixel on the base substrate base is arranged in the orthographic projection of the light extraction structure on the base substrate base, or the orthographic projection of the light extraction structure on the base substrate base coincides with the orthographic projection of the pixel on the base substrate base. The pixel includes an anode, a cathode and a light-emitting layer arranged between the anode and the cathode, and the area where the pixel is arranged is defined by a pixel defining layer of the display substrate.

In some embodiments of the present disclosure, the orthographic projection of the light-shielding pattern on the base substrate and the orthographic projection of the gap between adjacent pixels on the base substrate are completely overlapped, so that the light-shielding pattern does not affect the aperture ratio of the display substrate, and on the other hand, can shield light rays which are taken out through the light extraction structure and emitted to adjacent pixels to the greatest extent, thereby avoiding the problem of image blur.

Figure 1B:
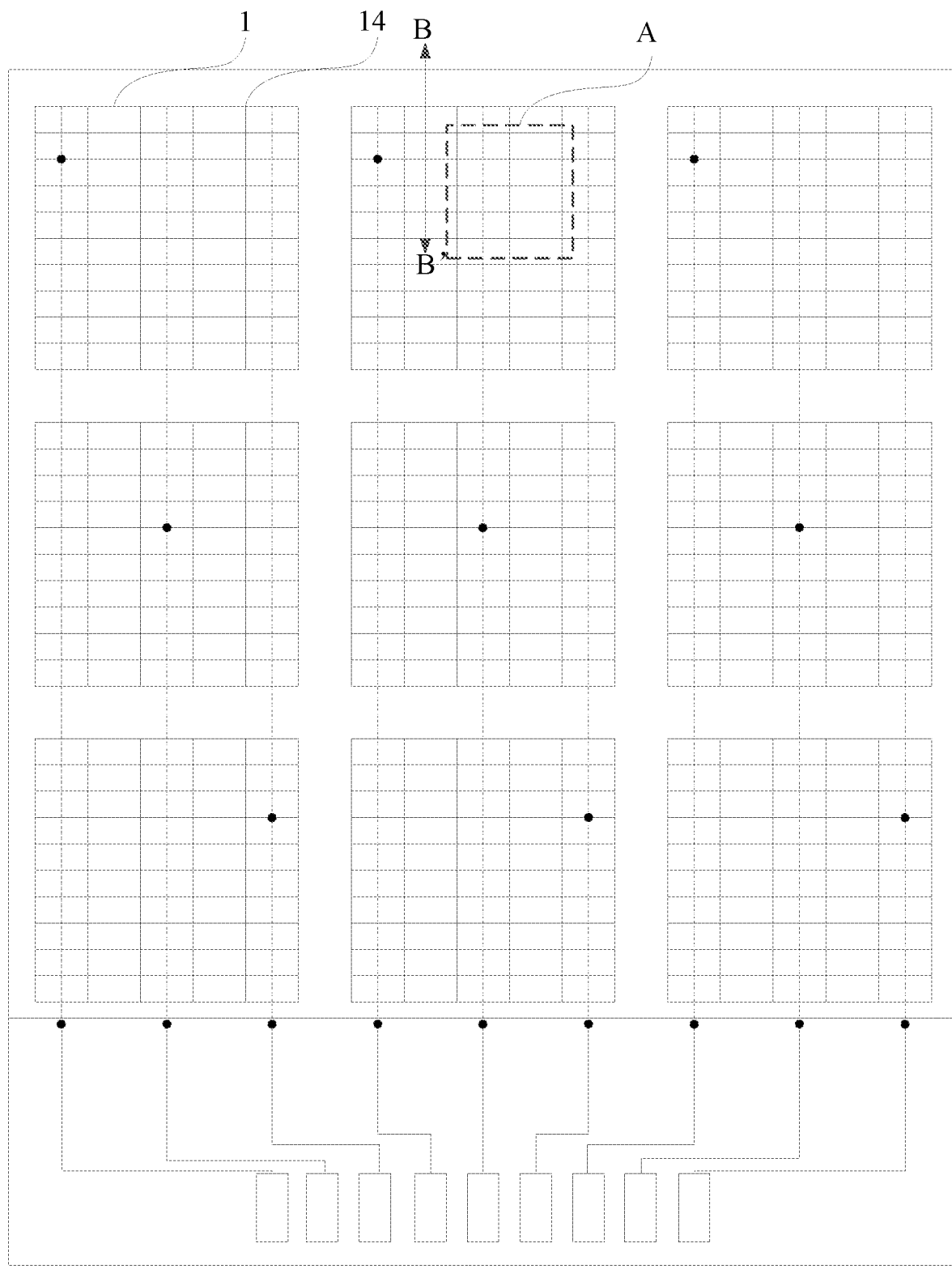
Figure 2:
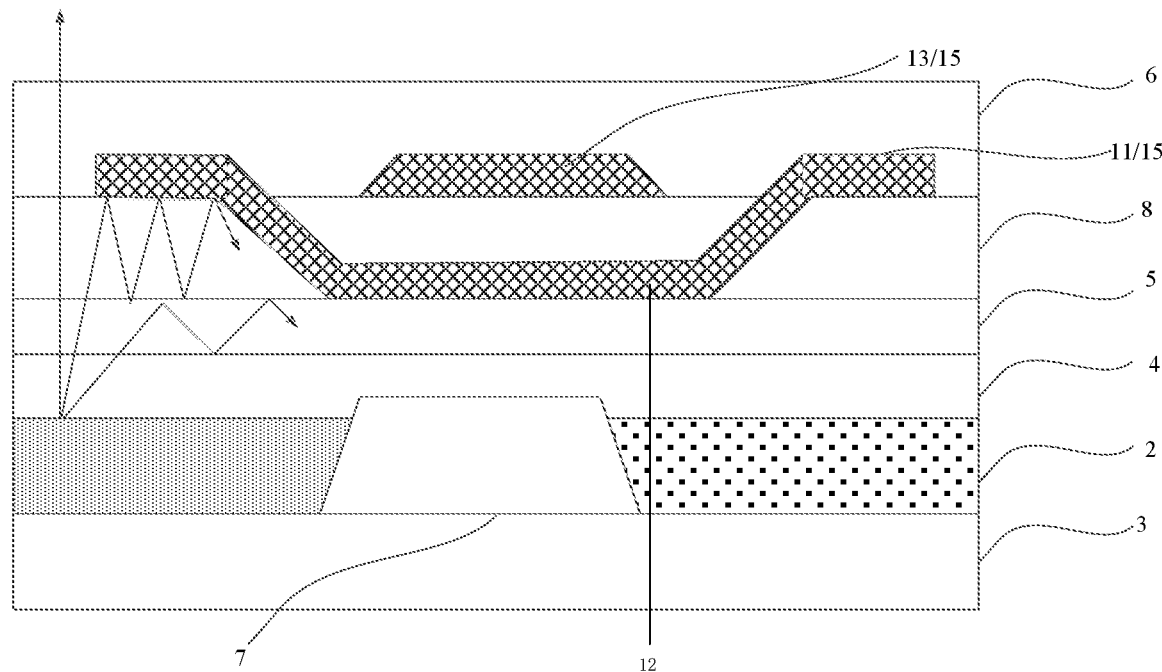
FIG. 2 is a schematic cross-sectional view of a display substrate in a DD' direction in the related art.
Figure 3:
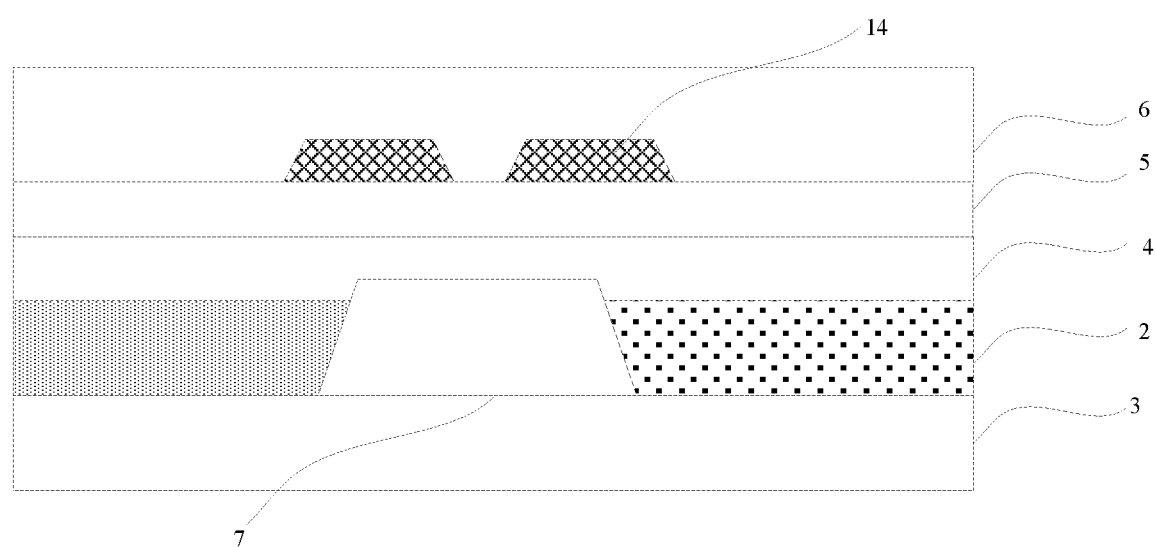
FIG. 3 is a schematic cross-sectional view of a display substrate in a direction BB in the related art'.

For a display substrate integrated with a touch function, a touch electrode is disposed on the display substrate. In order to reduce the impedance of the touch electrode while avoiding a light emitting area of the display substrate, the touch electrode is mostly designed by using a metal grid, as shown in FIG. 1A and FIG. 2, the touch electrode may be designed by using a grid of double-layer metal, the touch electrode includes a first touch sub-electrode 11 and a second touch sub-electrode 13 arranged on the same layer, the first touch sub-electrode 11 is arranged along a second direction, the second touch sub-electrode 13 is arranged along a third direction, the third direction is intersected with the second direction, adjacent second touch sub-electrodes 13 are directly connected, and adjacent first touch sub-electrodes 11 are connected by using a touch electrode bridge 12 of a different layer. The touch electrode may also be a grid-shaped design with a single layer of metal, as shown in FIG. 1B and FIG. 3, and includes a plurality of touch sub-electrodes 14 arranged at the same layer and separated from each other.

Figure 1C:
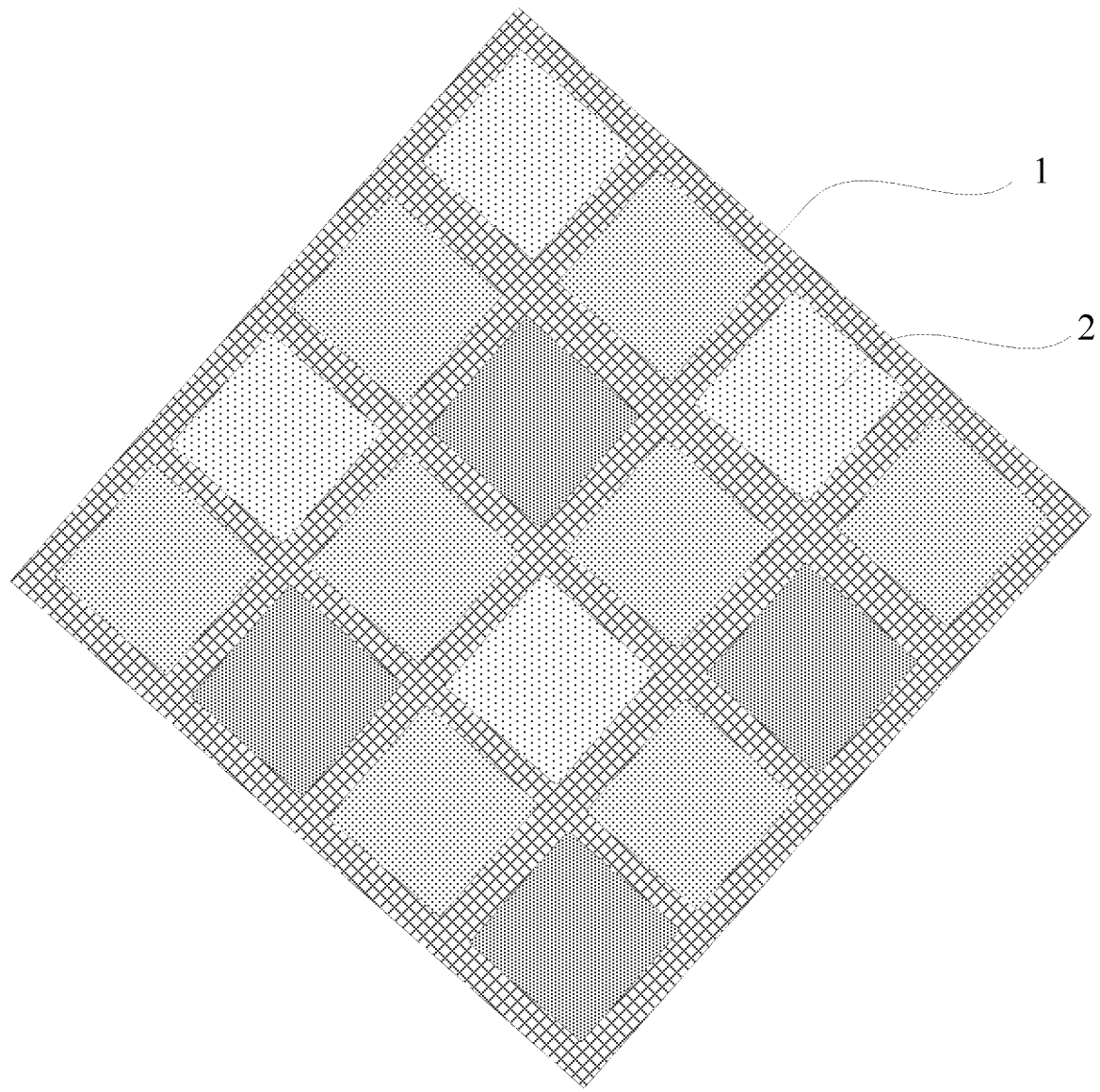
FIG. 1C is an enlarged view of region A.

As shown in FIG. 1C, the metal grid-shaped touch electrode 1 defines an area where the pixel 2 is arranged.

As most of the touch electrodes are made of opaque metal and have light shielding performance, as shown by arrows in FIG. 2, light emitted from the pixels 2 and emitted to adjacent pixels is shielded by the touch electrodes; and the latticed touch electrode is arranged around the pixels, each metal grid corresponds to one pixel 2 of the display substrate, and the orthographic projection of the pixel 2 on the base substrate is superposed with the orthographic projection of the hollow area defined by the corresponding metal grid on the base substrate, so that the touch electrode 11/13 can be simultaneously used as a light-shielding pattern 15 of the display substrate.

In some embodiments of the present disclosure, the display substrate further includes:

an encapsulation layer covering the plurality of pixels;

the light-shielding pattern is arranged on a side, away from the pixels, of the encapsulation layer, and the light-shielding pattern is made of a conductive material and is reused as a touch electrode.

In some embodiments of the present disclosure, the light-shielding patterns are reused as the touch electrodes, so that the structure of the display substrate can be simplified, and the production cost of the display substrate can be reduced.

After the light-shielding pattern is arranged on the display substrate, the light extraction structure is arranged on the light outlet side of the pixel, the effect of improving the light extraction efficiency can be achieved, and the light-shielding pattern can shield the light which is extracted through the light extraction structure and emitted to the adjacent pixel, so that the light extracted through the light extraction structure can be emitted through the adjacent pixel, and therefore the technical scheme of the embodiment can be applied to the small-sized display product, and the purpose of improving the light extraction efficiency of the small-sized display product is achieved.

In some embodiments of the present disclosure, the light extraction structure may include one light extraction layer; or the light extraction structure includes at least two light extraction layers which are sequentially arranged in the direction from the part close to the base substrate to the part away from the base substrate.

Figure 4:
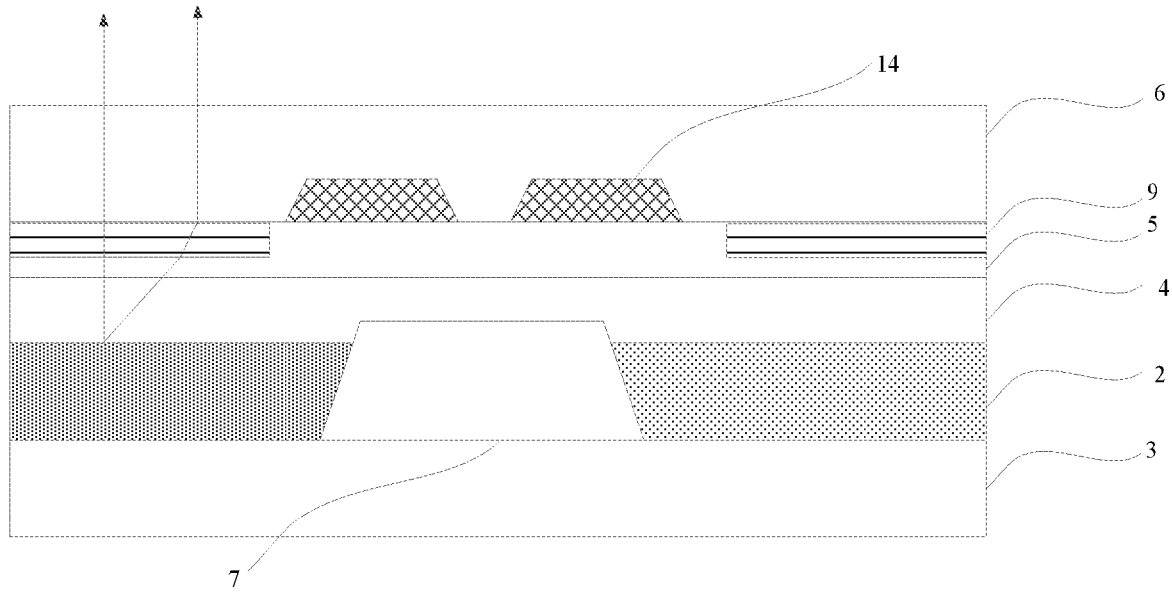
FIG. 4 is a schematic cross-sectional view of a display substrate in some embodiments of the present disclosure in a direction BB' of FIG. 1B.

As shown in FIG. 4, in some embodiments of the present disclosure, the display substrate includes a pixel definition layer 7 on the base substrate 3, and the pixels 2 are arranged within the area defined by the pixel definition layer 7; an encapsulation layer 4 covering the pixels 2; a light extraction layer 9 and a buffer layer 5 on a side of the encapsulation layer 4 remote from the pixel 2; the touch sub-electrode 14 is arranged on a side of the buffer layer 5 away from the pixel 2; and the second insulating layer 6 covers the touch sub-electrodes 14. In this embodiment, a light extraction layer 9 is disposed on the light-emitting side of the pixel 2, and the light extraction layer 9 can change the direction of the light emitted from the pixel 2, reduce the included angle between the light emitted from the pixel 2 and the first direction, and increase the extraction of forward light, thereby improving the light extraction efficiency of the display substrate, where the first direction is a direction perpendicular to the base substrate 3; in addition, because the touch sub-electrode 14 is arranged on the side of the light extraction layer 9 away from the pixel 2, the touch sub-electrode 14 is made of metal, has light-shielding performance, and can shade the light which is extracted by the light extraction layer 9 and irradiates to the adjacent pixel, thereby avoiding the problem of image blurring.

Figure 5:
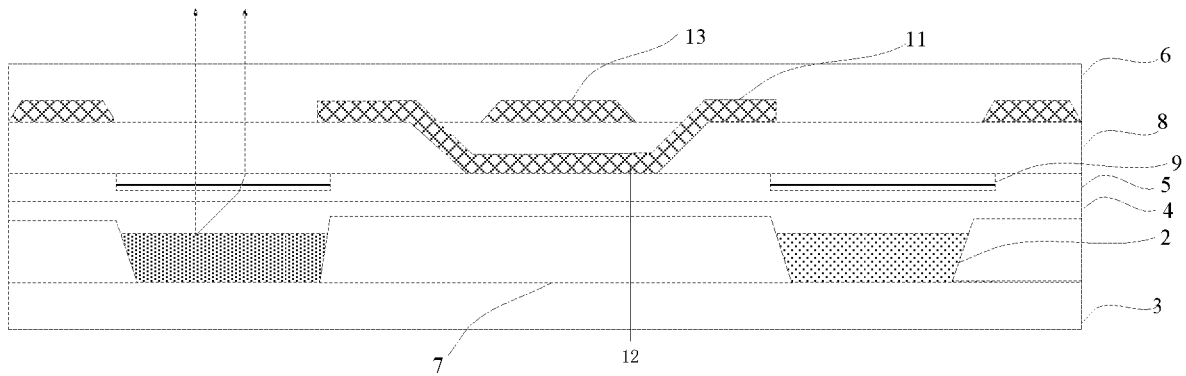
FIG. 5 is a schematic cross-sectional view of a display substrate in some embodiments of the present disclosure in a direction DD' shown in FIG. 1A.

As shown in FIG. 5, in some embodiments of the present disclosure, the display substrate includes a pixel definition layer 7 on the base substrate 3, and the pixels 2 are arranged within the area defined by the pixel definition layer 7; an encapsulation layer 4 covering the pixels 2; a light extraction layer 9 and a buffer layer 5 on a side of the encapsulation layer 4 remote from the pixel 2; a touch electrode bridge 12, a first touch sub-electrode 11 and a second touch sub-electrode 13 which are arranged on a side of the buffer layer 5 away from the pixel 2, where a first insulating layer 8 is arranged between the first touch sub-electrode 11, the second touch sub-electrode 13 and the touch electrode bridge 12; the second touch sub-electrode 13 and the first touch sub-electrode 11 are arranged on a side of the first insulating layer 8 away from the pixel 2; and a second insulating layer 6 covering the first touch sub-electrode 11 and the second touch sub-electrode 13. In this embodiment, a light extraction layer 9 is disposed on the light-emitting side of the pixel 2, and the light extraction layer 9 can change the direction of the light emitted from the pixel 2, reduce the included angle between the light emitted from the pixel 2 and the first direction, and increase the extraction of forward light, thereby improving the light extraction efficiency of the display substrate, where the first direction is a direction perpendicular to the base substrate 3; in addition, because the first touch sub-electrode 11, the second touch sub-electrode 13 and the touch electrode bridge 12 are arranged on the side of the light extraction layer 9 away from the pixel 2, and the first touch sub-electrode 11, the second touch sub-electrode 13 and the touch electrode bridge 12 are made of metal, the light extraction layer has light shielding performance, and can shield light rays which are extracted by the light extraction layer 9 and irradiate to adjacent pixels, so that the problem of image blurring can be avoided.

Figure 6:
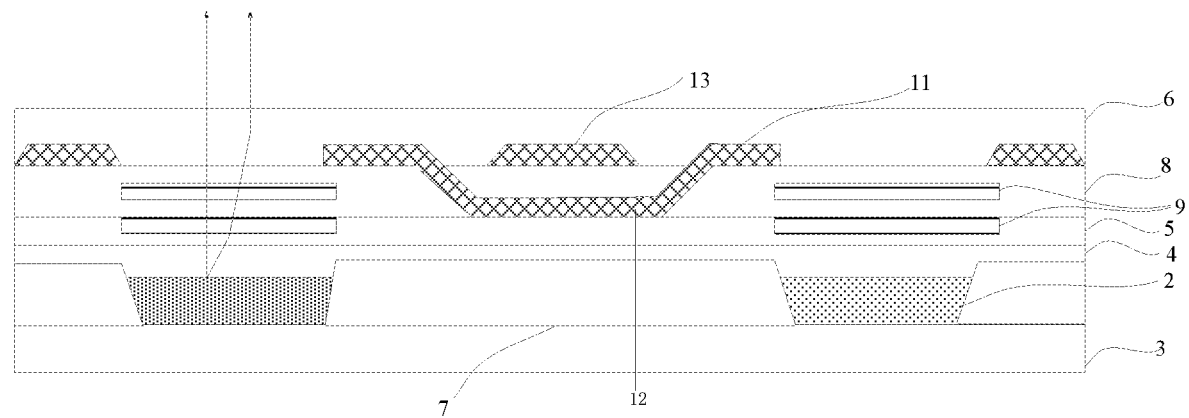
FIG. 6 is a schematic cross-sectional view of a display substrate in some embodiments of the present disclosure in the direction DD' shown in FIG. 1A.

As shown in FIG. 6, in some embodiments of the present disclosure, the display substrate includes a pixel definition layer 7 on the base substrate 3, and the pixels 2 are arranged within the area defined by the pixel definition layer 7; an encapsulation layer 4 covering the pixels 2; a light extraction layer 9 and a buffer layer 5 on a side of the encapsulation layer 4 remote from the pixel 2; the touch electrode bridge 12 and the light extraction layer 9 are arranged on a side of the buffer layer 5 away from the pixel 2; a first insulating layer 8 on a side of the light extraction layer 9 remote from the pixels 2; the second touch sub-electrode 13 is arranged on a side of the first insulating layer 8 away from the pixel 2; and the second insulating layer 6 covers the second touch sub-electrode 13. In this embodiment, two light extraction layers 9 are disposed on the light exit side of the pixel 2, and the light extraction layers 9 can change the direction of the light emitted from the pixel 2, reduce the included angle between the light emitted from the pixel 2 and the first direction, and increase the extraction of forward light, thereby improving the light exit efficiency of the display substrate, where the first direction is a direction perpendicular to the base substrate 3; in addition, because the second touch sub-electrode 13 and the touch electrode bridge 12 are arranged on the side of the light extraction layer 9 away from the pixel 2, the second touch sub-electrode 13 and the touch electrode bridge 12 have light shielding performance, and can shield light rays which are extracted from the light extraction layer 9 and irradiate to an adjacent pixel, so that the problem of image blurring can be avoided. In this embodiment, the display substrate is provided with two light extraction layers 9, and the light extraction efficiency of the display substrate can be further improved as compared with a case where a single light extraction layer is provided.

The light extraction layer is made of the light-transmitting material, so that the emergent light rays are not influenced, and the light extraction layer can be designed into a whole layer, so that the manufacturing process of the light extraction layer can be simplified. When the display substrate includes only a single light extraction layer, the light extraction layer may be disposed only in a partial region of the display substrate, for example, an orthographic projection of the light extraction layer on the base substrate coincides with an orthographic projection of the pixels on the base substrate; or, the light extraction layer is a unitary layer. When the display substrate includes at least two light extraction layers, at least one of the light extraction layers can be arranged on only a partial area of the display substrate, and the other light extraction layers can be a whole layer; or all the light extraction layers are a whole layer; or, all the light extraction layers are provided only in a partial region of the display substrate.

Figure 7:
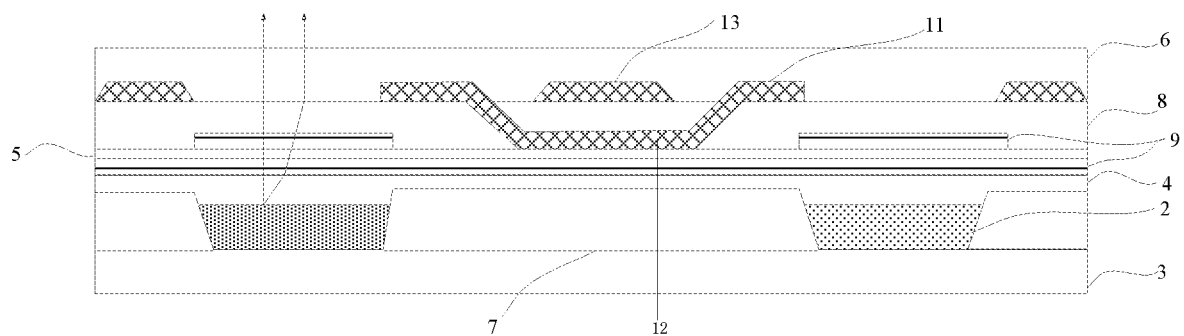
FIG. 7 is a schematic cross-sectional view of a display substrate in some embodiments of the present disclosure in the direction DD' shown in FIG. 1A.

In some embodiments of the present disclosure, as shown in FIG. 7, the display substrate includes a pixel definition layer 7 on the base substrate 3, the pixels 2 being arranged within an area defined by the pixel definition layer 7; an encapsulation layer 4 covering the pixels 2; a light extraction layer 9 on a side of the encapsulation layer 4 remote from the pixels 2; a buffer layer 5 on a side of the light extraction layer 9 away from the base substrate 3; the touch electrode bridge 12 and the light extraction layer 9 are arranged on a side of the buffer layer 5 away from the pixel 2; a first insulating layer 8 on a side of the light extraction layer 9 remote from the pixels 2; the second touch sub-electrode 13 is arranged on a side of the first insulating layer 8 away from the pixel 2; and the second insulating layer 6 covers the second touch sub-electrode 13. In this embodiment, two light extraction layers 9 are disposed on the light exit side of the pixel 2, and the light extraction layers 9 can change the direction of the light emitted from the pixel 2, reduce the included angle between the light emitted from the pixel 2 and the first direction, and increase the extraction of forward light, thereby improving the light exit efficiency of the display substrate, where the first direction is a direction perpendicular to the base substrate 3; in addition, because the second touch sub-electrode 13 and the touch electrode bridge 12 are arranged on the side of the light extraction layer 9 away from the pixel 2, the second touch sub-electrode 13 and the touch electrode bridge 12 have light shielding performance, and can shield light rays which are extracted from the light extraction layer 9 and irradiate to an adjacent pixel, so that the problem of image blurring can be avoided. In this embodiment, the display substrate is provided with two light extraction layers 9, where the light extraction layer close to the pixel 2 is designed as a whole layer, and the light extraction layer far from the pixel 2 only occupies a partial area of the display substrate.

In some embodiments of the present disclosure, the light extraction layer includes a first light extraction layer, the first light extraction layer includes at least two layers of light-transmitting material layers arranged in a stacked manner, and the refractive index of the light-transmitting material layers increases from being close to the base substrate to being away from the base substrate, so that the light extraction layer 9 can change the direction of the emergent light of the pixel 2, reduce the included angle between the emergent light of the pixel 2 and the first direction, and increase the extraction of forward light.

Alternatively, the refractive indexes of the light-transmitting material layers are in a trend of high-low alternative arrangement in the direction from the part close to the base substrate base to the part away from the base substrate base, for example, a first light-transmitting material layer, a second light-transmitting material layer, a third light-transmitting material layer, a fourth light-transmitting material layer, . . . and an m-th light-transmitting material layer are sequentially arranged in the direction from the part close to the base substrate base to the part away from the base substrate base, where the refractive index of the second light-transmitting material layer is greater than that of the first light-transmitting material layer, the refractive index of the third light-transmitting material layer is smaller than that of the second light-transmitting material layer, the refractive index of the fourth light-transmitting material layer is greater than that of the third light-transmitting material layer, and so on. The first light extraction layer includes at least two layers of light-transmitting material layers, where at least one light-transmitting material layer layer can be a whole layer, and the other layers of light-transmitting material layers are only arranged in partial areas of the display substrate; or all the light-transmitting material layers are a whole layer; or, all the light-transmitting material layers are arranged only in a partial region of the display substrate.

Figure 8:
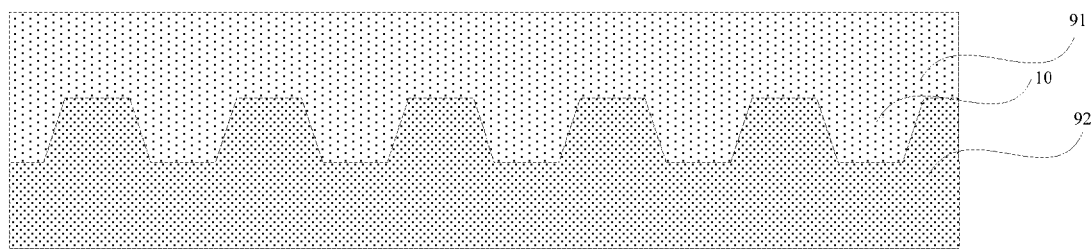
FIG. 8 is a schematic structural view of a light extraction layer in some embodiments of the present disclosure.

In some embodiments of the present disclosure, as shown in FIG. 8, the first light extraction layer includes a first light-transmitting material layer 91 and a second light-transmitting material layer 92 which are stacked, the second light-transmitting material layer 92 is arranged on a side of the first light-transmitting material layer 91 away from the base substrate, and a surface of the first light-transmitting material layer 91 facing the second light-transmitting material layer 92 is provided with a plurality of grooves 10. The refractive index of the first light-transmitting material layer 91 is smaller than that of the second light-transmitting material layer 92, the grooves 10 on the surface of the first light-transmitting material layer 91 can be arrayed, and when the light emitted from the pixel 2 irradiates the interface between the first light-transmitting material layer 91 and the second light-transmitting material layer 92, the light can be deflected and emitted towards the center of the pixel 2, so that the forward light is increased to be taken out, and the light extraction efficiency of the display substrate is improved. The cross section of the groove 10 in the direction parallel to the base substrate may be circular or rectangular, and certainly, the cross section of the groove 10 in the direction parallel to the base substrate is not limited to be circular or rectangular, and may also be in other shapes.

Figure 9:
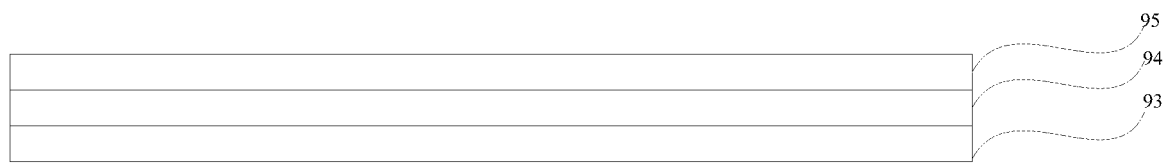
FIG. 9 is a schematic structural view of a light extraction layer in some embodiments of the present disclosure.

In some embodiments of the present disclosure, as shown in FIG. 9, the first light extraction layer includes a third light-transmitting material layer 93, a fourth light-transmitting material layer 94 and a fifth light-transmitting material layer 95 which are stacked, and a refractive index of the light-transmitting material layers increases from a direction close to the base substrate to a direction away from the base substrate, so that when light emitted from the pixel 2 irradiates an interface between two adjacent light-transmitting material layers, the light is deflected and emitted toward a center of the pixel 2, thereby increasing forward light extraction and improving light extraction efficiency of the display substrate.

Figure 10:
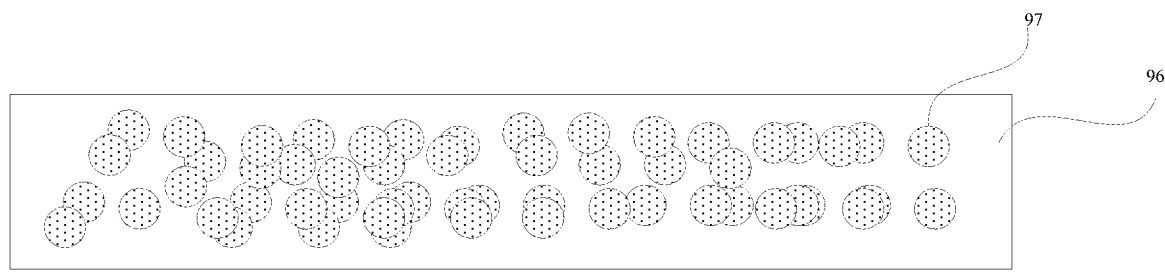
FIG. 10 is a schematic structural view of a light extraction layer in some embodiments of the present disclosure.

In some embodiments of the present disclosure, as shown in FIG. 10, the light extraction layer includes a second light extraction layer, the second light extraction layer includes a light-transmitting material layer 96 and a plurality of refraction particles 97 arranged in the light-transmitting material layer 96, the refraction particles 97 have a refractive index greater than that of the light-transmitting material layer 96, so that the light emitted from the pixel 2 irradiates on the light-transmitting material layer 96, and is deflected when emitted from the light-transmitting material layer 96 and emitted toward the center of the pixel 2, thereby increasing the extraction of forward light and improving the light extraction efficiency of the display substrate.

The display substrate includes an insulating film layer, a buffer layer, a first insulating layer, a second insulating layer and the like, where the insulating film layer includes an inorganic insulating layer in a encapsulation layer, the buffer layer, the first insulating layer, the second insulating layer and the like, the insulating film layers are all made of light-transmitting insulating materials, and in order to simplify the structure of the display substrate, at least one light-transmitting material layer forming a light extraction layer can be used for multiplexing at least one of the following insulating film layers of the display substrate: the buffer layer is formed on the inorganic insulating layer.

In some embodiments of the present disclosure, the display substrate includes an encapsulation layer covering the plurality of pixels, the encapsulation layer including an inorganic insulating layer, the light-transmitting material layer multiplexing the inorganic insulating layer.

In some embodiments of the present disclosure, the display substrate includes a package layer covering the plurality of pixels, and a touch electrode arranged on a side of the package layer away from the pixels, the touch electrode includes first touch sub-electrodes arranged on the same layer and arranged along a second direction, and second touch sub-electrodes arranged along a third direction, the third direction is intersected with the second direction, adjacent second touch sub-electrodes are directly connected, adjacent first touch sub-electrodes are connected through touch electrode bridges of different layers, a first insulating layer is spaced between the first touch sub-electrodes, the second touch sub-electrodes, and the touch electrode bridges, and the light-transmitting material layer is reused as the first insulating layer.

In some embodiments of the present disclosure, the display substrate includes an encapsulation layer covering the plurality of pixels, a buffer layer arranged on a side of the encapsulation layer away from the pixels, and a touch electrode arranged on a side of the buffer layer away from the pixels, and the light-transmitting material layer is reused with the buffer layer.

In some embodiments of the present disclosure, the display substrate includes an encapsulation layer covering the plurality of pixels, a touch electrode arranged on a side of the encapsulation layer away from the pixels, and a second insulating layer arranged on a side of the touch electrode away from the pixels, and the light-transmitting material layer multiplexes the second insulating layer.

When the first insulating layer is multiplexed on the light-transmitting material layer, a groove can be prepared on the surface of a side, away from the base substrate, of the first insulating layer, and a groove can also be prepared on a side, close to the base substrate, of the first insulating layer; when the second insulating layer is multiplexed on the light-transmitting material layer, a groove can be prepared on the surface of a side, close to the base substrate, of the second insulating layer; when the buffer layer is reused on the light-transmitting material layer, a groove can be prepared on the surface of a side of the buffer layer, which is away from the base substrate, and a groove can also be prepared on a side of the buffer layer, which is close to the base substrate; when the light-transmitting material layer is reused as the inorganic insulating layer, a groove can be prepared on the surface of a side of the inorganic insulating layer, which is away from the base substrate, and a groove can also be prepared on a side of the inorganic insulating layer, which is close to the base substrate. When the display substrate includes a plurality of light extraction layers, a first light extraction layer, a second light extraction layer, . . . and an nth light extraction layer are sequentially arranged in the direction from the base substrate close to the display substrate to the base substrate away from the display substrate, in order to ensure the light extraction efficiency of the display substrate, where the refractive index of the light-transmitting material layer of the k-th light extraction layer close to the (k+1)-th light extraction layer is smaller than that of the light-transmitting material layer of the k-th light extraction layer close to the k-th light extraction layer, and k is an integer greater than or equal to 1 and less than or equal to n.

In addition, when the light-transmitting insulating film layer of the display substrate is disposed on the side of the light extraction layer away from the base substrate of the display substrate, in order to ensure the light extraction efficiency of the display substrate, the refractive index of the light-transmitting material layer of the light extraction layer close to the light-transmitting insulating film layer is smaller than the refractive index of the light-transmitting insulating film layer.

The embodiment of the present disclosure also provides a display device, which includes the display substrate as described above. The display device includes but is not limited to: radio frequency unit, network module, audio output unit, input unit, sensor, display unit, user input unit, interface unit, memory, processor, and power supply. It will be appreciated by those skilled in the art that the above-described display device is not limited in its construction and that the display device may include more or fewer of the elements described above, or some of the elements may be combined, or a different arrangement of elements may be used. In the disclosed embodiment, the display device includes, but is not limited to, a display, a mobile phone, a tablet computer, a television, a wearable electronic device, a navigation display device, and the like.

The display device may be: the display device includes a television, a display, a digital photo frame, a mobile phone, a tablet personal computer and any other product or component with a display function, where the display device further includes a flexible circuit board, a printed circuit board and a back plate.

The embodiment of the present disclosure further provides a method for forming a display substrate, including:

forming a plurality of pixels arranged in an array on a substrate;

forming a light-shielding pattern on a side of the pixels away from the base substrate, where an orthographic projection of the light-shielding pattern on the base substrate is overlapped with an orthographic projection of a gap between adjacent pixels on the base substrate;

forming a light extraction structure at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate.

In this embodiment, a light extraction structure is disposed on the light-emitting side of the pixel, and the light extraction structure can improve the light extraction rate of the display substrate; meanwhile, the light-shielding pattern is arranged on a side, away from the base substrate, of the pixel, the orthographic projection of the light-shielding pattern on the base substrate is overlapped with the orthographic projection of the gap between the adjacent pixel on the base substrate, so that the light-shielding pattern can shade light rays which are taken out through the light extraction structure and shoot to the adjacent pixel, the light rays taken out through the light extraction structure are prevented from being emitted through the adjacent pixel, and the problem of image blurring is avoided.

The method for forming the display substrate of this embodiment is used to form the display substrate described in the above embodiment, where the orthographic projection of the light extraction structure on the base substrate may be arranged within the orthographic projection of the pixel on the base substrate, or the orthographic projection of the pixel on the base substrate is arranged within the orthographic projection of the light extraction structure on the base substrate, or the orthographic projection of the light extraction structure on the base substrate coincides with the orthographic projection of the pixel on the base substrate. The pixel includes an anode, a cathode and a light-emitting layer arranged between the anode and the cathode, and the area where the pixel is arranged is defined by a pixel defining layer of the display substrate.

In some embodiments of the present disclosure, the orthographic projection of the light-shielding pattern on the base substrate and the orthographic projection of the gap between adjacent pixels on the base substrate are completely overlapped, so that the light-shielding pattern does not affect the aperture ratio of the display substrate, and on the other hand, can shield light rays which are taken out through the light extraction structure and emitted to adjacent pixels to the greatest extent, thereby avoiding the problem of image blur.

For a display substrate integrated with a touch function, a touch electrode is disposed on the display substrate. In order to reduce the impedance of the touch electrode while avoiding a light emitting area of the display substrate, the touch electrode is mostly designed by using a metal grid, as shown in FIG. 1A and FIG. 2, the touch electrode may be designed by using a grid of double-layer metal, the touch electrode includes a first touch sub-electrode 11 and a second touch sub-electrode 13 arranged on the same layer, the first touch sub-electrode 11 is arranged along a second direction, the second touch sub-electrode 13 is arranged along a third direction, the third direction is intersected with the second direction, adjacent second touch sub-electrodes 13 are directly connected, and adjacent first touch sub-electrodes 11 are connected by using a touch electrode bridge 12 of a different layer. The touch electrode may also be a grid-shaped design with a single layer of metal, as shown in FIG. 1B and FIG. 3, and includes a plurality of touch sub-electrodes 14 arranged at the same layer and separated from each other.

As shown in FIG. 1C, the metal grid-shaped touch electrode 1 defines an area where the pixel 2 is arranged.

As most of the touch electrodes are made of opaque metal and have light shielding performance, as shown by arrows in FIG. 2, light emitted from the pixels 2 and emitted to adjacent pixels is shielded by the touch electrodes; and the latticed touch electrode is arranged around the pixels, each metal grid corresponds to one pixel 2 of the display substrate, and the orthographic projection of the pixel 2 on the base substrate is superposed with the orthographic projection of the hollow area defined by the corresponding metal grid on the base substrate, so that the touch electrode can be simultaneously used as a light-shielding pattern of the display substrate.

In some embodiments of the present disclosure, a method for manufacturing a display substrate includes:

forming an encapsulation layer covering the plurality of pixels;

forming a light-shielding pattern on a side of the encapsulation layer, which is away from the pixels, where the light-shielding pattern is made of a conductive material and is reused as a touch electrode.

In this embodiment, the light-shielding patterns are reused as the touch electrodes, so that the structure of the display substrate can be simplified, and the production cost of the display substrate can be reduced.

After the light-shielding pattern is arranged on the display substrate, the light extraction structure is arranged on the light outlet side of the pixel, the effect of improving the light extraction efficiency can be achieved, and the light-shielding pattern can shield the light which is extracted through the light extraction structure and emitted to the adjacent pixel, so that the light extracted through the light extraction structure can be emitted through the adjacent pixel, and therefore the technical scheme of the embodiment can be applied to the small-sized display product, and the purpose of improving the light extraction efficiency of the small-sized display product is achieved.

It should be noted that, in this specification, each embodiment is described in a progressive manner, and the same and similar parts between the embodiments are referred to each other, and each embodiment focuses on the differences from other embodiments. In particular, for the embodiments, since they are substantially similar to the product embodiments, the description is simple, and reference may be made to the partial description of the product embodiments for relevant points.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. The word "including" or "includes", and the like, means that the element or item preceding the word includes the element or item listed after the word and its equivalent, but does not exclude other elements or items. The terms "connected" or "coupled" and the like are not restricted to physical or mechanical connections, but may include electrical connections, whether direct or indirect. "upper", "lower", "left", "right", and the like are used only to indicate relative positional relationships, and when the absolute position of the object being described is changed, the relative positional relationships may also be changed accordingly.

It will be understood that when an element such as a layer, film, region or substrate is referred to as being "on" or "under" another element, it can be "directly on" or "under" the other element or intervening elements may be present.

In the foregoing description of embodiments, the particular features, structures, materials, or characteristics may be combined in any suitable manner in any one or more embodiments or examples.

The above description is only for some embodiments of the present disclosure, but the scope of the present disclosure is not limited thereto, and any person skilled in the art can easily think of the changes or replacements within the technical scope of the present disclosure, and shall cover the scope of the present disclosure. Therefore, the protection scope of the present disclosure should be subject to the scope of the claims.

What is claimed is:

1. A display substrate, comprising:
   a plurality of pixels arranged in an array on a base substrate;
   a light-shielding pattern at a side, away from the base substrate, of the pixels, and an orthographic projection of the light-shielding pattern on the base substrate is overlapped with an orthographic projection of a gap between adjacent pixels on the base substrate;
   a light extraction structure arranged at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate;
   wherein the light-shielding pattern is made of a conductive material and is reused as a touch electrode,
   the light extraction structure comprises one light extraction layer; or the light extraction layer comprises at least two light extraction layers which are sequentially arranged along a direction away from the base substrate,
   the light extraction layer comprises a first light extraction layer, the first light extraction layer comprises at least two layers of light-transmitting materials arranged in a stacked manner, and a refractive index of the light-transmitting materials increases or undulates in a direction away from the base substrate,
   the first light extraction layer comprises a first light-transmitting material layer and a second light-transmitting material layer arranged in a stacked manner, the second light-transmitting material layer is arranged on a side of the first light-transmitting material layer away from the base substrate, and a plurality of grooves are disposed on a side surface of the first light-transmitting material layer facing the second light-transmitting material layer.

2. The display substrate according to claim 1, further comprising: an encapsulation layer covering the plurality of pixels;
   wherein the light-shielding pattern is arranged at a side, away from the pixels, of the encapsulation layer.

3. The display substrate according to claim 2, wherein the touch electrode comprises a plurality of touch control sub-electrodes which are arranged on the same layer and are separated from each other; or
   the touch electrodes comprise first touch control sub-electrodes and second touch control sub-electrodes arranged on the same layer, wherein the first touch control sub-electrodes are distributed along a second direction, the second touch control sub-electrodes are distributed along a third direction, the third direction is intersected with the second direction, adjacent second touch control sub-electrodes are directly connected, and adjacent first touch control sub-electrodes are connected through touch electrode bridges of different layers.

4. The display substrate according to claim 3, wherein the touch electrode is made of metal meshes, each metal mesh corresponds to one pixel of the display substrate, and an orthographic projection of the pixel on the base substrate coincides with an orthographic projection of a hollow area defined by the corresponding metal mesh on the base substrate.

5. The display substrate according to claim 1, further comprising an encapsulation layer covering the plurality of pixels, wherein the encapsulation layer comprises an inorganic insulating layer, the light-transmitting material layer is reused as the inorganic insulating layer, and a side surface of the inorganic insulating layer, which is away from the pixels, and/or a side surface of the inorganic insulating layer, which is close to the pixels, is provided with a plurality of grooves.

6. The display substrate according to claim 1, further comprising an encapsulation layer covering the plurality of pixels, a touch electrode on a side of the encapsulation layer away from the pixels, the touch control electrodes comprise first touch control sub-electrodes which are arranged on the same layer and distributed along a second direction and second touch control sub-electrodes which are distributed along a third direction, the third direction is intersected with the second direction, adjacent second touch sub-electrodes are directly connected, adjacent first touch sub-electrodes are connected through a touch electrode bridge of different layers, a first insulating layer is arranged between the first touch sub-electrode, the second touch sub-electrode and the touch electrode bridge, the light-transmitting material layer is reused with the first insulating layer, and a plurality of grooves are formed in a side surface, away from the pixels, of the first insulating layer and/or a side surface, close to the pixels, of the first insulating layer.

7. The display substrate according to claim 1, further comprising an encapsulation layer covering the plurality of pixels, a buffer layer arranged on a side of the encapsulation layer away from the pixels, and a touch electrode arranged on a side of the buffer layer away from the pixels, wherein the light-transmitting material layer is reused for the buffer layer, and a plurality of grooves are arranged on a surface of a side of the buffer layer away from the pixels and/or a surface of a side of the buffer layer close to the pixels.

8. The display substrate according to claim 1, further comprising an encapsulation layer covering the plurality of pixels, a touch electrode arranged on a side of the encapsulation layer away from the pixels, and a second insulating layer arranged on a side of the touch electrode away from the pixels, wherein the light-transmitting material layer is reused with the second insulating layer, and a plurality of grooves are formed in a surface of the second insulating layer on a side close to the pixels.

9. The display substrate according to claim 1, wherein the light extraction layer comprises a second light extraction layer comprising a light-transmitting material layer and a plurality of refractive particles within the light-transmitting material layer, a refractive index of the refractive particles is greater than a refractive index of the light-transmitting material layer.

10. The display substrate according to claim 1, wherein an orthographic projection of the light extraction layer on the base substrate coincides with an orthographic projection of the pixels on the base substrate; or, the light extraction structure is a unitary layer.

11. The display substrate according to claim 1, wherein a refractive index of the first light-transmitting material layer is less than a refractive index of the second light-transmitting material layer.

12. The display substrate according to claim 1, wherein the first light extraction layer comprises a third light-transmitting material layer, a fourth light-transmitting material layer and a fifth light-transmitting material layer sequentially disposed in a direction away from the base substrate, wherein a refractive index of the third light-transmitting material layer is smaller than a refractive index of the fourth light-transmitting material layer, and a refractive index of the fourth light-transmitting material layer is smaller than a refractive index of the fifth light-transmitting material layer.

13. The display substrate according to claim 1, wherein the light extraction layer comprises a first light extraction layer and a second light extraction layer, the orthographic projections of the first and second light extraction layers on the base substrate coincide.

14. The display substrate according to claim 1, wherein the light extraction layer comprises a first light extraction layer and a second light extraction layer, an orthographic projection of the second light extraction layer on the base substrate covers an orthographic projection of a plurality of pixels on the base substrate.

15. A display device comprising the display substrate according to claim 1.

16. A method for forming a display substrate, comprising:
forming a plurality of pixels arranged in an array on a base substrate;
forming a light-shielding pattern on a side of the pixels away from the base substrate, wherein an orthographic projection of the light-shielding pattern on the base substrate is overlapped with an orthographic projection of a gap between adjacent pixels on the base substrate;
forming a light extraction structure at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate;
wherein the light-shielding pattern is made of a conductive material and is reused as a touch electrode,
the light extraction structure comprises one light extraction layer; or the light extraction layer comprises at least two light extraction layers which are sequentially arranged along a direction away from the base substrate,
the light extraction layer comprises a first light extraction layer, the first light extraction layer comprises at least two layers of light-transmitting materials arranged in a stacked manner, and a refractive index of the light-transmitting materials increases or undulates in a direction away from the base substrate,
the first light extraction layer comprises a first light-transmitting material layer and a second light-transmitting material layer arranged in a stacked manner, the second light-transmitting material layer is arranged on a side of the first light-transmitting material layer away from the base substrate, and a plurality of grooves are disposed on a side surface of the first light-transmitting material layer facing the second light-transmitting material layer.

17. The display device according to claim 15, further comprising: an encapsulation layer covering the plurality of pixels;
wherein the light-shielding pattern is arranged at a side, away from the pixels, of the encapsulation layer.

18. A display substrate, comprising:
a plurality of pixels arranged in an array on a base substrate;
a light-shielding pattern at a side, away from the base substrate, of the pixels, and an orthographic projection of the light-shielding pattern on the base substrate is overlapped with an orthographic projection of a gap between adjacent pixels on the base substrate;
a light extraction structure arranged at a light-emitting side of the pixel and a side of the light-shielding pattern adjacent to the base substrate, a light-emitting direction of the light extraction structure is a direction of the light extraction structure away from the pixels, and an orthographic projection of the light extraction structure on the base substrate is overlapped with an orthographic projection of the pixels on the base substrate,
wherein the light-shielding pattern is made of a conductive material and is reused as a touch electrode,
the light extraction structure comprises one light extraction layer; or the light extraction layer comprises at least two light extraction layers which are sequentially arranged along a direction away from the base substrate,
the light extraction layer comprises a second light extraction layer comprising a light-transmitting material layer and a plurality of refractive particles within the light-transmitting material layer, a refractive index of the refractive particles is greater than a refractive index of the light-transmitting material layer.

* * * * *